(12) United States Patent
Bai et al.

(10) Patent No.: US 9,897,815 B2
(45) Date of Patent: Feb. 20, 2018

(54) OPTICAL ALIGNMENT DEVICE AND SPATIAL BEAM SPLITTING PRISM THEREOF

(71) Applicant: Shenzhen China Star Optoelectronics Technology Co., Ltd., Shenzhen, Guangdong (CN)

(72) Inventors: Bai Bai, Guangdong (CN); Xinhui Zhong, Guangdong (CN)

(73) Assignee: Shenzhen China Star Optoelectronics Technology Co., Ltd, Shenzhen Guangdong (CN)

( * ) Notice: Subject to any disclaimer, the term of this patent is extended or adjusted under 35 U.S.C. 154(b) by 235 days.

(21) Appl. No.: 14/894,572

(22) PCT Filed: Oct. 26, 2015

(86) PCT No.: PCT/CN2015/092847
§ 371 (c)(1),
(2) Date: Nov. 30, 2015

(87) PCT Pub. No.: WO2017/049705
PCT Pub. Date: Mar. 30, 2017

(65) Prior Publication Data
US 2017/0115495 A1    Apr. 27, 2017

(30) Foreign Application Priority Data
Sep. 23, 2015  (CN) .......................... 2015 1 0611803

(51) Int. Cl.
*G02B 5/04* (2006.01)
*G02B 27/12* (2006.01)
(Continued)

(52) U.S. Cl.
CPC ............ *G02B 27/126* (2013.01); *C23C 16/26* (2013.01); *C23C 16/44* (2013.01); *G02B 5/04* (2013.01);
(Continued)

(58) Field of Classification Search
CPC .... G02B 27/126; G02B 27/1073; G02B 5/04; G02B 27/285; G02B 5/1833;
(Continued)

(56) References Cited

U.S. PATENT DOCUMENTS 6,278,552 B1 *  8/2001  Ishihara ............... G02B 27/285
                                                            359/619

FOREIGN PATENT DOCUMENTS

CN        201853032 U     6/2011
CN        103399431 A    10/2013
(Continued)

*Primary Examiner* — Euncha Cherry
(74) *Attorney, Agent, or Firm* — Andrew C. Cheng

(57) ABSTRACT

An optical alignment device and a spatial beam splitting prism thereof are provided. The optical alignment device includes a polarized UV light source and a spatial beam splitting prism including a light-transmissive substrate. At least one of top and bottom surfaces of the substrate has a prism structure which is disposed by areas to have at least two refraction directions. When light rays emitted from the polarized UV light source are incident perpendicular to the spatial beam splitting prism, the light rays in a same area are deflected along a same slanting direction after being refracted by the prism structure, and the light rays in neighboring areas are deflected along different slanting directions after being refracted by the prism structure. The invention can achieve the purpose of performing multi-area alignments by only one time UV light irradiation, and also can save production time, reduce production difficulty and thereby increase productivity.

6 Claims, 3 Drawing Sheets

(51) Int. Cl.
 *G02F 1/1337* (2006.01)
 *C23C 16/26* (2006.01)
 *C23C 16/44* (2006.01)
 *G02B 27/10* (2006.01)
 *G02F 1/1335* (2006.01)

(52) U.S. Cl.
 CPC ....... *G02B 27/1073* (2013.01); *G02F 1/1337* (2013.01); *G02F 1/133516* (2013.01)

(58) Field of Classification Search
 CPC ......... G02F 1/133516; G02F 1/133617; G02F 2201/343; C23C 16/44; C23C 16/26
 USPC ........................................................ 359/837
 See application file for complete search history.

(56) References Cited

FOREIGN PATENT DOCUMENTS

| | | |
|---|---|---|
| CN | 103399431 A | 11/2013 |
| JP | 2001242465 A | 9/2001 |
| JP | 2009042426 A | 2/2009 |
| JP | 2015075626 A | 4/2015 |

\* cited by examiner

OPTICAL ALIGNMENT DEVICE AND SPATIAL BEAM SPLITTING PRISM THEREOF

BACKGROUND OF THE INVENTION

1. Technical Field

The invention generally relates to the field of display technology, and particularly to an optical alignment device and a spatial beam splitting prism thereof.

2. Description of Related Art

Thin film transistor liquid crystal display (TFT-LCD) devices in recent years have had rapid development and wide applications. In brief, The TFT-LCD device can be regarded as two glass substrates with a layer of liquid crystal interposed therebetween, the upper glass substrate being a color filter, and the lower glass substrate being disposed with thin film transistors. When a current flows through the thin film transistor, a change of electric field is generated, and the change of electric field causes liquid crystal molecules to be deflected, which would change the polarity of light and thereby achieve a desired display purpose. Before applying a voltage, the liquid crystal molecules are necessarily made to have an initial orientation/alignment direction, and therefore alignment films usually are needed in the display panel and for controlling arrangement direction and angle of the liquid crystal molecules.

With the progress of alignment technology, an alignment process of optical alignment technology has gradually replaced the traditional rubbing alignment process. The role of an optical alignment film is to replace traditional raised structures or trench structures, which avoids the light leakage caused by the traditional raised and trench structures, greatly improves the aperture ratio, and makes liquid crystal molecules of sub-pixel area to have an initial pre-tilt angle so that the response speed is increased.

As illustrated in FIG. 1, in the current optical alignment technology, usually, a glass substrate 200 firstly is coated with an alignment film 300, a polarized UV light then is used to irradiate the alignment film 300 at a certain angle of inclination (i.e., exposure) so as to perform an alignment processing on the alignment film 300. By such processing, when liquid crystal molecules 500 are filled between glass substrates, the liquid crystal molecules 500 would have a pre-tilt angle along a certain direction.

FIG. 2A through FIG. 2E illustrate a process of performing multi-area alignments by current optical alignment technology. As illustrated in FIG. 2A, a planar photomask 100 with a plurality of opaque blocking strips 101 spaced from each other is disposed on a glass substrate 200 coated with an optical alignment film, an obliquely incident polarized UV light then is used to irradiate the alignment film so as to perform a first time UV alignment. As illustrated in FIG. 2B, the areas 301 are areas performed with the first time alignment, and the arrows A represent the first time alignment direction. Subsequently, as illustrated in FIG. 2C, the glass substrate 200 performed with the first time alignment is rotated with 180 degrees. Then, as illustrated in FIG. 2D, the blocking strips 101 of the planar photomask 100 are used to align with and cover the areas 301 performed with the first time UV alignment, so as to achieve the alignment of the planar photomask 100. After that, the obliquely incident polarized UV light is used to irradiate again, so as to complete a second time UV alignment, the areas 302 are areas completed with the second time alignment, and the arrows B represent the second time alignment direction (as denoted in FIG. 2E). Therefore, in the above mentioned optical alignment process, if it is required to perform alignments to different areas, it must to rotate the glass substrate 200 several times to perform multiple exposures or change the incident direction of the UV light multi-times, so as to achieve the purpose of multi-area alignments. Such multiple UV irradiations not only cause long working hours for a single piece, but also during the process of performing the multiple UV irradiations corresponding to the multi-times rotations of the glass substrate, the alignment error of the planar photomask would cause the decrease of precision and meanwhile cause a higher risk of workpiece being broken.

SUMMARY

In order to overcome the drawbacks in the prior art, the invention provides an optical alignment device. The optical alignment device can achieve the purpose of multi-area alignments by one time polarized UV light irradiation and form pre-tilt angles along different directions, and therefore can save production time and reduce production difficulty.

According to an aspect of the invention, an optical alignment device is provided. The optical alignment device includes: a polarized UV light source and a spatial beam splitting prism. The spatial beam splitting prism includes a light-transmissive substrate. At least one surface of a top surface and a bottom surface of the light-transmissive substrate has a prism structure, the prism structure is disposed by areas to have at least two refraction directions, and thereby when light rays emitted from the polarized UV light source are incident perpendicular to the spatial beam splitting prism, the light rays in a same area would be deflected along a same slanting direction after being refracted by the prism structure, and the light rays in neighboring areas would be deflected along different slanting directions after being refracted by the prism structure.

According to an exemplary embodiment of the invention, the prism structure is constituted by right-angle triangular prisms. A right-angle face of each the right-angle triangular prism is perpendicular to the at least one surface of the light-transmissive substrate, another right-angle face of the right-angle triangular prism is coincident with the at least one surface of the light-transmissive substrate, and a slanting face of the right-angle triangular prism and the at least one surface of the light-transmissive substrate have an intersection angle in the range of 5~60 degrees.

According to an exemplary embodiment of the invention, the light-transmissive substrate is demarcated into a plurality of areas, each of the plurality of areas is long strip-shaped, the right-angle triangular prisms in a same area are periodically arranged, and the right-angle triangular prisms in neighboring areas have different slanting directions.

According to an exemplary embodiment of the invention, the spatial beam splitting prism is made of a transparent material.

According to an exemplary embodiment of the invention, the prism structure is formed by directly machining on the light-transmissive substrate, or the prism structure is individually manufactured from the substrate and then combined with the light-transmissive substrate together.

According to another aspect of the invention, a spatial beam splitting prism is provided. The spatial beam splitting prism includes a light-transmissive substrate, At least one of a top surface and a bottom surface of the light-transmissive substrate has a prism structure, the prism structure is disposed by areas to have at least two refraction directions, and thereby when light rays emitted from an external light source are incident perpendicular to the spatial beam splitting prism, the light rays incident into a same area would be deflected along a same slanting direction after being refracted by the prism structure, and the light rays incident into neighboring areas would be deflected along different slanting directions after being refracted by the prism structure.

According to an exemplary embodiment of the invention, the prism structure is constituted by right-angle triangular prisms; for each of the right-angle triangular prisms, a right-angle face is perpendicular to the surface of the light-transmissive substrate, another right-angle face is coincident with the surface of the light-transmissive substrate, and a slanting face and the surface of the light-transmissive substrate have an intersection angle in the range of 5~60 degrees.

According to an exemplary embodiment of the invention, the light-transmissive substrate is demarcated into a plurality of areas, each of the plurality of areas is long strip-shaped, the right-angle triangular prisms in a same area are periodically arranged, and the right-angle triangular prisms in neighboring areas have different slanting directions.

According to an exemplary embodiment of the invention, the spatial beam splitting prism is made of a transparent material.

According to an exemplary embodiment of the invention, the prism structure is formed by directly machining on the light-transmissive substrate, or is manufactured individually from the substrate and then combined with the light-transmissive substrate together.

The optical alignment device according to the embodiments of the invention disposes a prism structure to achieve different deflection directions of light in different areas, when a polarized UV light are incident onto the optical alignment device along a perpendicular direction, the polarized UV light after being refracted by the prism structure would be deflected along at least two directions, and therefore the purpose of performing multi-area alignments by one time polarized UV light irradiation can be achieved. Moreover, since the optical alignment device according to the exemplary embodiments of the invention can perform multi-area alignments by one time UV light irradiation, it can overcome the problem of poor precision caused by substrate rotation and alignment in the prior art.

DETAILED DESCRIPTION OF EMBODIMENTS

An optical alignment device according to an exemplary embodiment of the invention will be described below in detail with reference to accompanying drawings. It should be noted that, the drawings are provided only to help the skilled in the art to completely understand the structure and working principle of the optical alignment device according to the exemplary embodiment of the invention, but are not intended to limit the invention.

Figure 1:
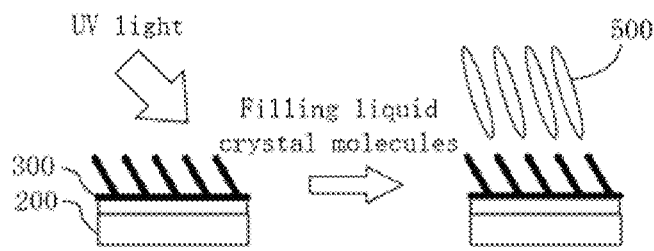
FIG. 1 shows a working principle of an optical alignment technology.
Figure 2A:
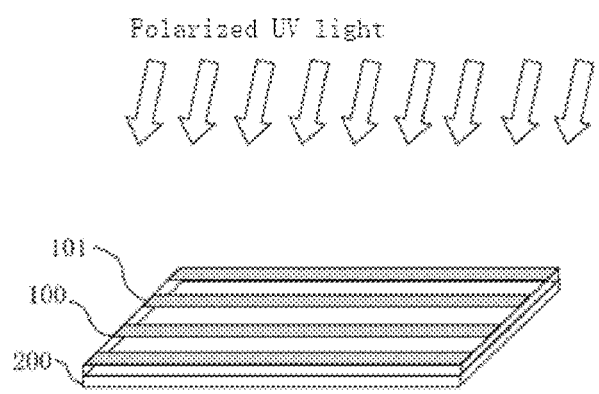
FIG. 2A through FIG. 2E show a process of performing multi-area alignments by a conventional optical alignment technology.
Figure 2B:
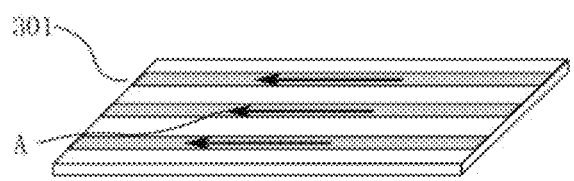
Figure 2C:
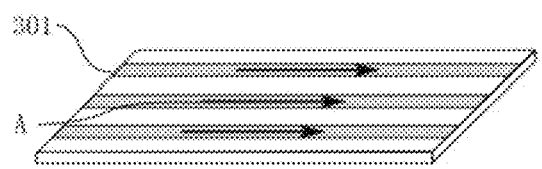
Figure 2D:
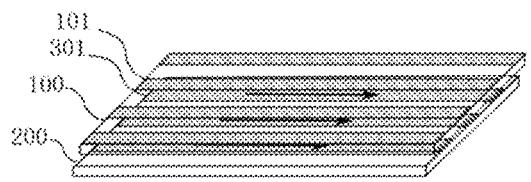
Figure 2E:
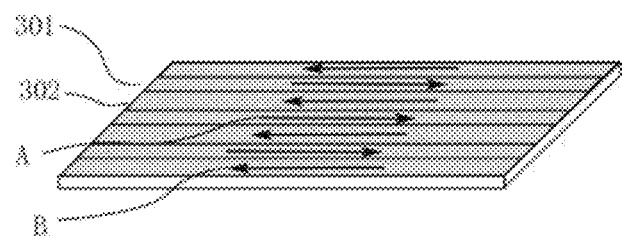
Figure 3:
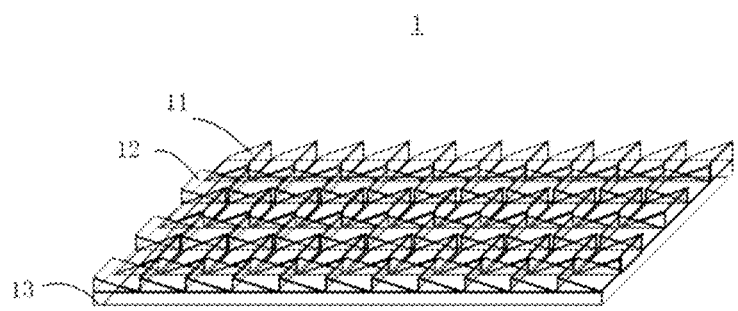
FIG. 3 is a schematic view of a spatial beam splitting prism of an optical alignment device according to an exemplary embodiment of the invention.

In particular, an optical alignment device according to the exemplary embodiment of the invention will be described below in detail with reference to FIG. 3 through FIG. 5. FIG. 3 is a schematic view of a spatial beam splitting prism 1 of the optical alignment device according to the exemplary embodiment of the invention, FIG. 4A through FIG. 4C are schematic views of working principle of the optical alignment device according to the exemplary embodiment of the invention, and FIG. 5 is a schematic view showing an effect of using one time UV light irradiation to perform multi-area alignments by the optical alignment device according to the exemplary embodiment of the invention.

As illustrated in FIG. 3, the spatial beam splitting prism 1 of the optical alignment device according to the exemplary embodiment of the invention may include a substrate 13 and a prism structure formed on a surface thereof. Preferably, the prism structure may be constituted by multiple (i.e., more than one) columns of right-angle triangular prisms. Moreover, for each of the right-angle triangular prisms, a right-angle face is perpendicular to the surface of the substrate 13, and another right-angle face is coincident with the surface of the substrate 13. Slanting faces of a same column of right-angle triangular prisms are facing toward a same direction, and slanting surfaces of neighboring columns of right-angle triangular prisms are facing toward opposite directions. Perpendicularly incident polarized UV light will strike into the slanting faces of the right-angle triangular prisms and emit out from the another right-angle faces of the right-angle triangular prisms. Preferably, the slanting face and the surface of the substrate 13 have an intersection angle of 5~60 degrees (i.e., the intersection angle is in the range from 5 degrees and 60 degrees). However, the invention is not limited to this, and other shaped prisms can be used to replace the right-angle triangular prisms. For example, according to other embodiment of the invention, a prism with a cross section of right-angle trapezoid can be used instead, and in this case, its slanting face can be used as a light incident surface, and its right-angle face opposite to the slanting face can be used as a light exit surface.

The substrate 13 is made of a transparent material resistant to UV light, such as quartz glass. Furthermore, the prism structure may be formed by directly engraving or embossing on the substrate 13, or the substrate 13 and the prism structure are formed individually and then combined with each other together.

In addition, although FIG. 3 illustrates the case of the prism structure being formed on the top surface of the substrate 13, it is not limited to this, and the prism structure may be disposed on at least one surface of the top surface and the bottom surface of the substrate 13.

In other words, in the exemplary embodiment of the invention, the surface of the substrate 13 is demarcated into multiple long strip-shaped areas, and in each long strip-shaped area, multiple right-angle triangular prisms 11 or 12 are disposed adjacent to one another (i.e., the right-angle triangular prisms arranged in a same column are closely next to one another). The slanting faces of the right-angle triangular prisms in a same strip-shaped area are facing toward a same direction, and the slanting faces of the right-angle triangular prisms in neighboring strip-shaped areas are facing toward opposite directions.

According to the exemplary embodiment, the multiple long strip-shaped areas include a first long strip-shaped area and a second long strip-shaped area disposed alternately and juxtaposed to each other. The first long strip-shaped area is disposed with multiple first right-angle triangular prisms 11 each having a slanting face facing toward a first direction, the second long strip-shaped area is disposed with multiple second right-angle triangular prisms 12 each having a slanting face facing toward a second direction. The first right-angle triangular prisms 11 and the second right-angle triangular prism 12 refract light toward different directions respectively. The second direction and the first direction are opposite to each other. In the illustrated exemplary embodiment, the first direction is the leftward direction, and the second direction is the rightward direction. However, the invention is not limited this, the directions which the slanting faces of the right-angle triangular prisms are facing toward can be set according to actual requirement.

A working principle of the optical alignment device according to the exemplary embodiment of the invention will be described below with reference to FIG. 4A through FIG. 4C.

Figure 4A:
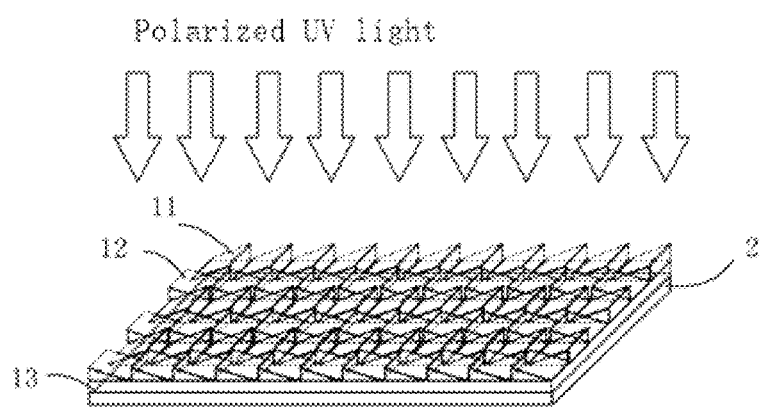
FIG. 4A through FIG. 4C are schematic views of working principle of an optical alignment device according to an exemplary embodiment of the invention.
Figure 4B:
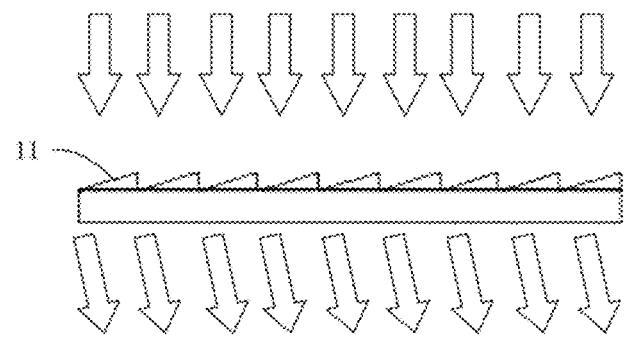
Figure 4C:
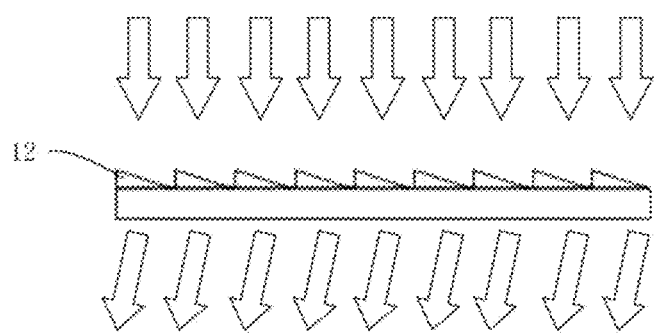
Figure 5:
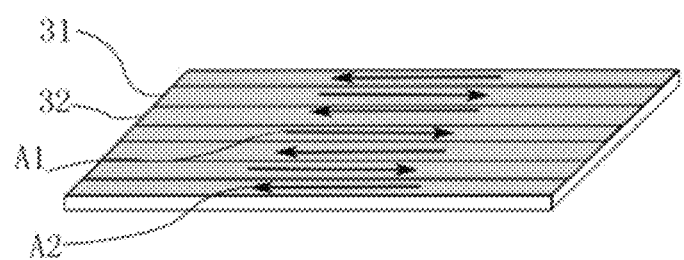
FIG. 5 is a schematic view showing an effect of using one time UV light irradiation to perform multi-area alignments by an optical alignment device according to an exemplary embodiment of the invention.

When the optical alignment device 1 is disposed above a glass substrate 2 coated with an alignment film, perpendicularly irradiated polarized UV light is incident from the slanting faces of the first right-angle triangular prisms 11 and the second right-angle triangular prisms 12 (as shown in FIG. 4A), then passes through the right-angle faces located at the substrate 13 and of the first right-angle triangular prisms 11 and the second right-angle triangular prisms 12, and finally exits out from the substrate 13 to form polarized UV light rays refracted along directions for irradiating different areas of the alignment film. Specifically, as shown in FIG. 4B, the first right-angle triangular prisms 11 refract the incident polarized UV light to make the polarized UV light to be deflected toward a first slanting direction. As shown in FIG. 4C, the second right-angle triangular prisms 12 refract the incident polarized UV light to make the polarized UV light to be deflected toward a second slanting direction. That is, perpendicularly incident polarized UV light would be deflected along the first slanting direction and the second slanting direction after passing through the first long strip-shaped area and the second long strip-shaped area of the optical alignment device 1 respectively.

After using the optical alignment device 1 as illustrated in FIG. 3 to form deflected UV lights to irradiate the alignment film coated on the glass substrate 2, the alignment film will form a first alignment area 31 and a second alignment area 32 (as shown in FIG. 5). In FIG. 5, the arrows A1 represent an alignment direction of the first alignment area 31, and the arrows A2 represent an alignment direction of the second alignment area 32. Accordingly, by using the optical alignment device 1 according to the exemplary embodiment of the invention, it is available to realize multi-area alignments by one time UV light irradiation and thereby provide pre-tilt angles along different directions for liquid crystal molecules. Widths of the first alignment area 31 and the second alignment area 32 respectively are equal to widths of the first long strip-shaped area and the second long strip-shaped area. The first alignment area 31 and the second alignment area 32 are corresponding to pixels, and the widths thereof preferably each are an integral multiple of a unit area size of sub-pixel. Correspondingly, the widths of the first long strip-shaped area and the second long strip-shaped area also preferably each are an integral multiple of the unit area size of sub-pixel.

In summary, the optical alignment device according to the embodiments of the invention disposes at least two columns of right-angle triangular prisms in parallel, the slanting faces of a same column of right-angle triangular prisms are facing toward a same direction, but the slanting faces of neighboring columns of right-angle triangular prisms are facing toward opposite directions, so that when polarized UV light is perpendicularly incident onto the optical alignment device, directions of lights emitted out from neighboring columns of right-angle triangular prisms are different from each other, and therefore the purpose of performing multi-area alignments by one time UV light irradiation and further providing different pre-tilt angles for liquid crystal molecules can be achieved. In addition, since the optical alignment device according to the exemplary embodiment of the invention can achieve multi-area alignments by one time UV light irradiation, the problem of poor precision caused by substrate rotation and alignment in the prior art can be overcome.

Although the invention has been shown and described with reference to the exemplary embodiments, it should be understood for the skilled in the art that without departing from the spirit and scope of the invention defined by claims and their equivalents, the multiple exemplary embodiments could be modified.

For example, the refraction directions of the long strip-shaped areas on the substrate, besides including the first slanting direction and the second slanting direction, may have a third slanting direction or even more directions. That is, the prism structure may produce two, three or even more refraction directions.

Furthermore, the demarcated areas on the substrate are not limited to be parallel long strip-shaped areas, and may be various regular or irregular areas such as grid-shaped areas or circled areas.

In addition, it may be that in some areas of the substrate, the prism structure is disposed on the top surface thereof while in other areas of the substrate, the prism structure is disposed on the bottom surface thereof; or in some areas of the substrate, both the top and bottom surfaces are disposed with the prism structure.

What is claimed is:
1. An optical alignment device comprising:
a polarized UV light source; and
a spatial beam splitting prism comprising a light-transmissive substrate,
wherein at least one of a top surface and a bottom surface of the light-transmissive substrate has a prism structure, the prism structure is disposed by areas to have at least two refraction directions, and thereby when light rays emitted from the polarized UV light source are incident perpendicular to the spatial beam splitting prism, the light rays in a same area are deflected along a same slanting direction after being refracted by the prism structure, and the light rays in neighboring areas are deflected along different slanting directions after being refracted by the prism structure;
the prism structure is constituted by right-angle triangular prisms; a right-angle face of each the right-angle triangular prism is perpendicular to the surface of the light-transmissive substrate, another right-angle face of the right-angle triangular prism is coincident with the surface of the light-transmissive substrate, and a slanting face of the right-angle triangular prism and the surface of the light-transmissive substrate have an intersection angle in the range of 5~60 degrees; and the light-transmissive substrate is demarcated into a plurality of areas, each of the plurality of areas is long strip-shaped, the right-angle triangular prisms in a same area are periodically arranged, and the right-angle triangular prisms in neighboring areas have different slanting directions.

2. The optical alignment device as claimed in claim 1, wherein the spatial beam splitting prism is made of a transparent material.

3. The optical alignment device as claimed in claim 1, wherein the prism structure is formed by directly machining on the light-transmissive substrate, or the prism structure is individually manufactured from the substrate and then combined with the light-transmissive substrate together.

4. A spatial beam splitting prism comprising a light-transmissive substrate, wherein at least one of a top surface and a bottom surface of the light-transmissive substrate has a prism structure, the prism structure is disposed by areas to have at least two refraction directions, and thereby when light rays emitted from an external light source are incident perpendicular to the spatial beam splitting prism, the light rays incident into a same area are deflected along a same slanting direction after being refracted by the prism structure, and the light rays incident into neighboring areas are deflected along different slanting directions after being refracted by the prism structure;

the prism structure is constituted by right-angle triangular prisms; for each of the right-angle triangular prisms, a right-angle face is perpendicular to the surface of the light-transmissive substrate, another right-angle face is coincident with the surface of the light-transmissive substrate, and a slanting face and the surface of the light-transmissive substrate have an intersection angle in the range of 5~60 degrees; and the light-transmissive substrate is demarcated into a plurality of areas, each of the plurality of areas is long strip-shaped, the right-angle triangular prisms in a same area are periodically arranged, and the right-angle triangular prisms in neighboring areas have different slanting directions.

5. The spatial beam splitting prism as claimed in claim 4, wherein the spatial beam splitting prism is made of a transparent material.

6. The spatial beam splitting prism as claimed in claim 4, wherein the prism structure is formed by directly machining on the light-transmissive substrate, or is manufactured individually from the substrate and then combined with the light-transmissive substrate together.

* * * * *